(12) United States Patent
Chan et al.

(10) Patent No.: US 8,570,064 B1
(45) Date of Patent: Oct. 29, 2013

(54) METHODS AND SYSTEMS FOR PROGRAMMABLE IMPLEMENTATION OF ON-CHIP TERMINATION CALIBRATION

(75) Inventors: Foong Tek Chan, Wilayah Persekutan (MY); Ket Chiew Sia, Pulau Pinang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/294,741

(22) Filed: Nov. 11, 2011

(51) Int. Cl.
*H03K 17/16* (2006.01)
*H03K 19/003* (2006.01)

(52) U.S. Cl.
USPC ............................... 326/30; 326/87; 327/112

(58) Field of Classification Search
USPC ............ 326/30, 82–83, 86–87; 327/108–109, 327/112
See application file for complete search history.

(56) References Cited

U.S. PATENT DOCUMENTS

| | | | |
|---|---|---|---|
| 5,781,028 A * | 7/1998 | Decuir | 326/30 |
| 5,872,471 A * | 2/1999 | Ishibashi et al. | 327/98 |
| 6,049,221 A * | 4/2000 | Ishibashi et al. | 326/30 |
| 6,445,245 B1 * | 9/2002 | Schultz et al. | 327/541 |
| 6,963,218 B1 * | 11/2005 | Alexander et al. | 326/30 |
| 7,489,160 B2 * | 2/2009 | Kimura | 326/30 |
| 7,613,853 B2 * | 11/2009 | Chauhan et al. | 710/61 |
| 7,884,638 B1 * | 2/2011 | Santurkar et al. | 326/30 |
| 8,022,723 B1 * | 9/2011 | Wang et al. | 326/30 |
| 2001/0040471 A1 * | 11/2001 | Urakawa | 327/112 |
| 2003/0080774 A1 * | 5/2003 | Funaba | 326/30 |
| 2004/0161878 A1 * | 8/2004 | Or-Bach et al. | 438/113 |
| 2006/0044008 A1 * | 3/2006 | Miyake et al. | 326/30 |

* cited by examiner

*Primary Examiner* — Jason M Crawford
(74) *Attorney, Agent, or Firm* — Ropes & Gray LLP

(57) ABSTRACT

Methods, circuits, and systems for termination calibration are provided. Differential input buffer circuitry is used to compare a signal level at an input/output pad and a first reference signal level. Control circuitry is used to control a controllably variable impedance based on the output of the differential input buffer circuitry. Optionally, second differential input buffer circuitry is used to compare the signal level at the input/output pad to a second reference signal level. The control circuitry is used to control the controllably variable impedance based on the output of both the first and the second differential input buffer circuitry.

18 Claims, 7 Drawing Sheets

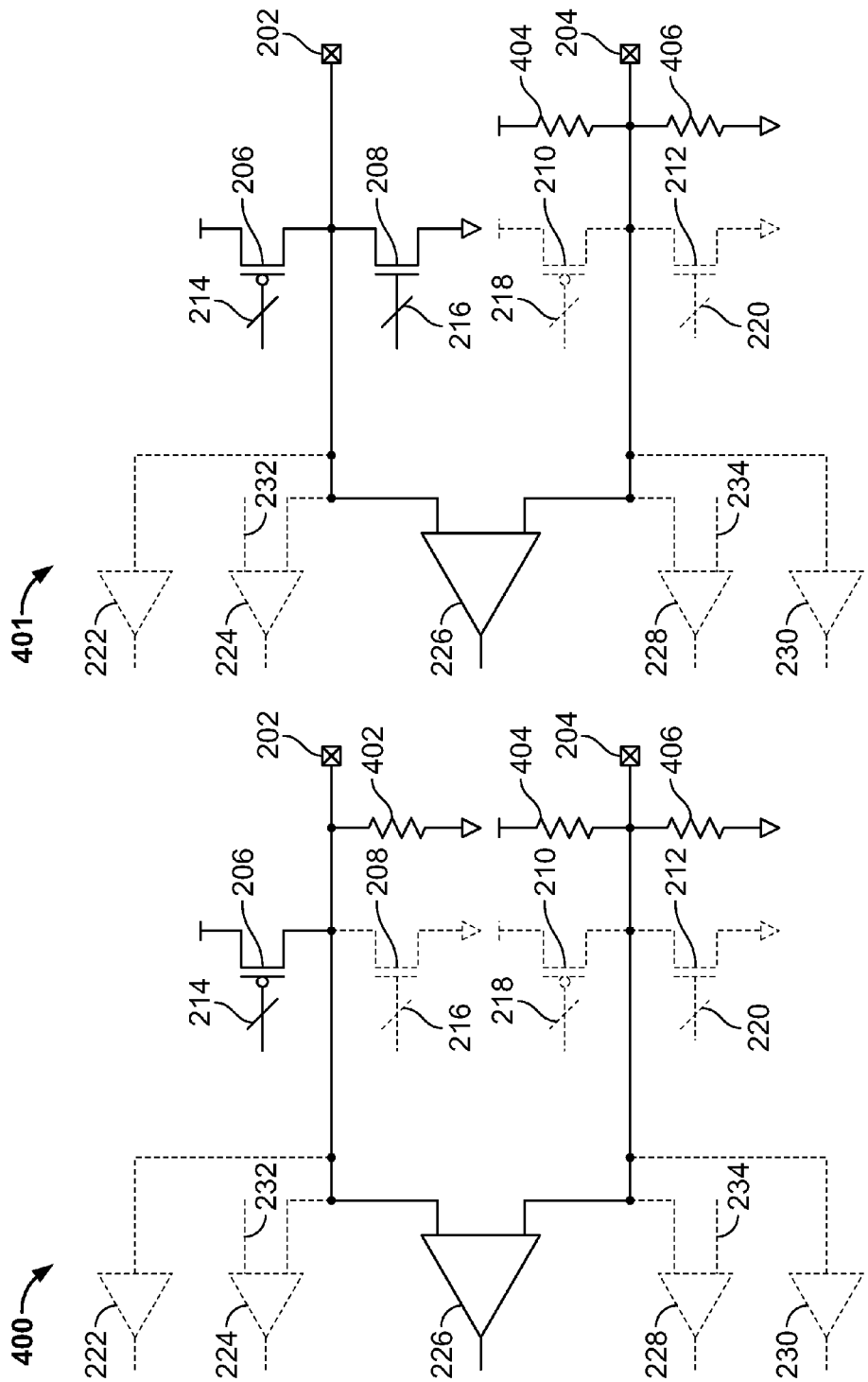

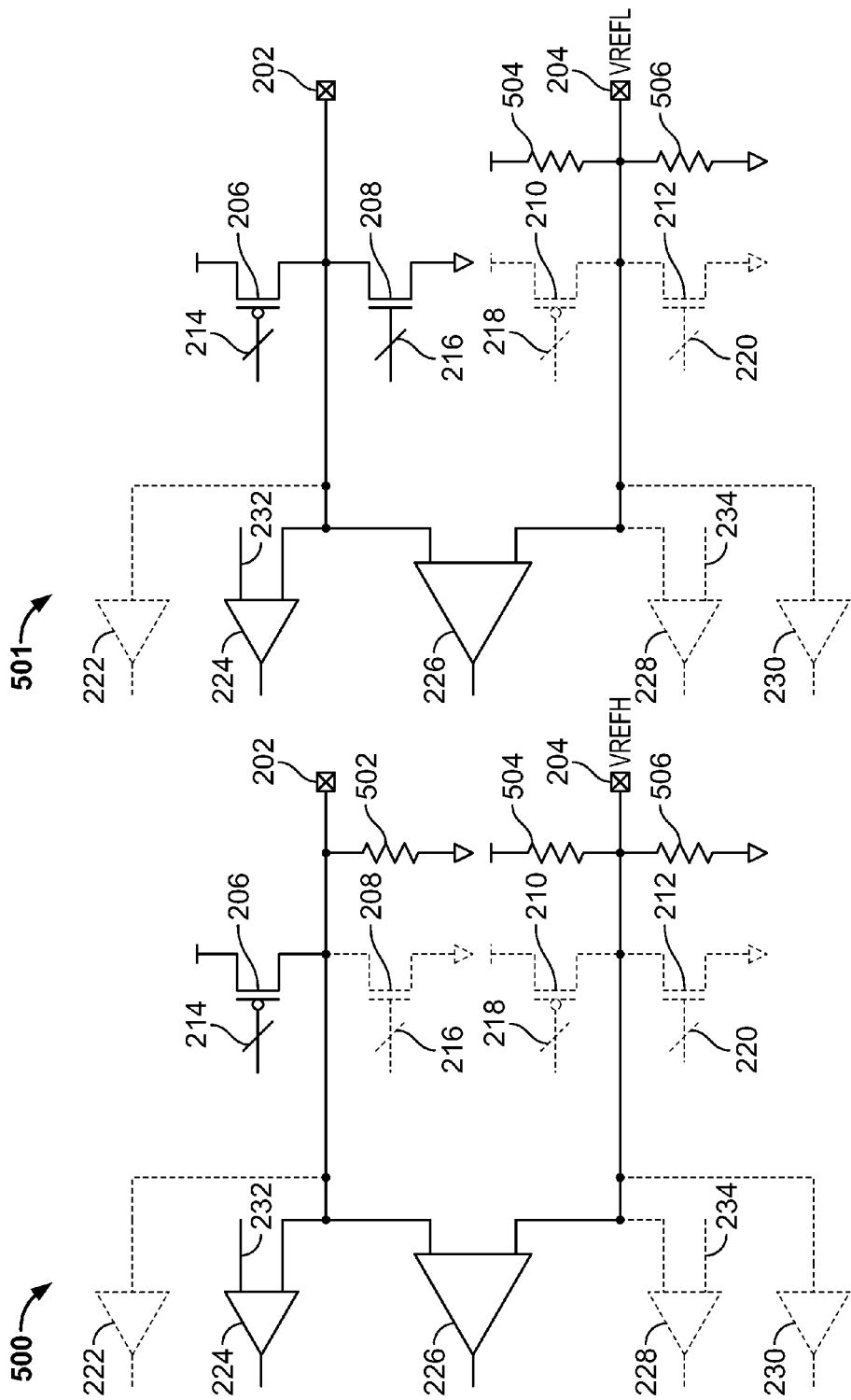

METHODS AND SYSTEMS FOR PROGRAMMABLE IMPLEMENTATION OF ON-CHIP TERMINATION CALIBRATION

BACKGROUND OF THE INVENTION

The present invention relates to communication systems and methods, and more specifically to using differential input buffer circuitry to provide termination calibration circuitry.

Data rates at circuit input and output pins have increased dramatically the last several years, and further increases are sure to follow. These high data rates place strict requirements on signal integrity. Transmitted and received signals need to be substantially free from glitches and other undesirable artifacts to maintain the highest possible data rates.

Reflections due to impedance mismatches are one source of these artifacts. Reflections are caused when a signal is received from a transmission line by a receiver having an impedance that does not match the impedance of the transmission line. This mismatch prevents some of the energy of the signal from being absorbed by the receiver. This unabsorbed energy is reflected back to the signal source. To prevent these reflections, a receiver termination impedance is connected from a receiver input to a ground voltage, where the termination impedance matches the impedance of the transmission line. The receiver termination impedance is in parallel with the receiver, so it is referred to as a parallel termination impedance. Similarly, reflections can be caused by mismatches between a transmitter and its transmission line, so a source termination impedance is connected between a transmitter output and the transmission line. A source impedance is in series with the transmitter, and is referred to as a series impedance.

When a circuit is used to both transmit and receive data, an input/output stage including a plurality of transistors can be configured to provide a series termination when transmitting and a parallel termination when receiving, thereby providing On-Chip Termination (OCT). The impedance provided by the input/output stage can be adjusted by enabling or disabling individual transistors within the plurality of transistors.

The impedance provided by the input/output stage needs to be calibrated in order to match the impedance of the transmission line and in order to account for variations due to supply voltage, temperature, and other environmental factors. During calibration, the impedance can be adjusted to be substantially equal to a reference resistance.

A system for calibrating termination impedance can be added to an existing system having an input/output stage. However, prior calibration circuits require additional external components to be added to the existing system in order to implement termination calibration functionality. More specifically, prior systems require external analog comparators to be added to the existing system in order to monitor the difference between an external resistance and an impedance of the existing system's input/output stage. Prior systems also require the use of additional digital logic to actively adjust the impedance of the input/output stage according to the comparators' outputs.

SUMMARY OF THE INVENTION

To address the above and other shortcomings within the art, the present invention provides systems and methods for using differential input buffer circuitry to provide termination calibration circuitry.

In one embodiment of the present invention, a system is provided that includes a first differential input buffer circuitry configured to output a first input buffer circuitry output signal by comparing a first signal level at a first input/output pad with a second signal level. The system further includes termination circuitry configured to provide a controllably variable impedance associated with the first input/output pad. The system further includes control circuitry configured to control the controllably variable impedance provided by the termination circuitry based at least in part on the first differential input buffer circuitry output signal. In some embodiments, the system further includes second differential input buffer circuitry configured to output a second differential input buffer circuitry output signal by comparing the first signal level associated with the first input/output pad with a third signal level, wherein the third signal level is different from the second signal level. In these embodiments, the control circuitry is further configured to control the impedance provided by the termination circuitry based at least in part on the second differential input buffer circuitry output signal.

In another embodiment of the present invention, a system is provided that includes a first input/output pad and a second input/output pad. The system further includes input/output circuitry that includes a first differential input buffer circuitry, wherein a first input of the first differential input buffer circuitry is coupled to the first input/output pad and a second input of the first differential input buffer circuitry is coupled to the second input/output pad. The input/output circuitry further includes a second differential input buffer circuitry, wherein a first input of the second differential input buffer circuitry is coupled to the first input/output pad, and a second input of the second differential input buffer circuitry is coupled a reference voltage level. The system further includes a programmable (i.e. reconfigurable) logic circuitry configured to control a controllably variable impedance provided by a termination circuitry based at least in part on an output voltage level of the first differential input buffer circuitry and based at least in part on an output voltage level of the second differential input buffer circuitry.

In yet another embodiment of the present invention, there is provided a method for using a circuit. The method includes providing a differential input buffer circuitry output signal by comparing, with differential input buffer circuitry, a first signal level associated with a circuit input/output pad with a second signal level. The method further includes controlling the impedance associated with the input/output pad based at least in part on the differential input buffer circuitry output signal.

Advantageously, the methods and systems variations thereof within the scope of the present invention can be implemented using existing components of input/output circuitry of an existing system. Accordingly, in some embodiments, it may be possible to implement the present invention without needing to modify the design of the system or add additional internal components to the system.

A further advantage of the present invention is that differential input buffers are present within input/output circuitries of a variety of existing systems, making the design of termination calibration systems and methods according to various embodiments of the present invention portable across the variety of existing systems.

A still further advantage of the present invention is that the control circuitry used to control the controllably variable impedance can be implemented using reconfigurable (i.e. soft) logic. This 'soft' implementation allows the system designer to easily change the calibration algorithm as needed, without the need to change any hardware components of the system.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which:

FIG. 4A shows another exemplary system for calibrating a pull-up circuit according to an embodiment of the present invention.

FIG. 4B shows another exemplary system for calibrating a pull-down circuit according to an embodiment of the present invention.

FIG. 5A shows yet another exemplary system for calibrating a pull-up circuit according to an embodiment of the present invention.

FIG. 5B shows yet another exemplary system for calibrating a pull-down circuit according to an embodiment of the present invention.

DETAILED DESCRIPTION

To provide an overall understanding of the invention, certain illustrative embodiments will now be described. However, it will be understood by one of ordinary skill in the art that the systems and methods described herein may be adapted and modified as is appropriate for the application being addressed and that the systems and methods described herein may be employed in other suitable applications, and that such other additions and modifications will not depart from the scope hereof.

Circuits communicate with each other by transmitting and receiving data over data interfaces. One such interface may be designed such that a first and a second circuit in communication with one another each include transmitting and receiving circuitry connected to the same data interface. According to this design, the first circuit is able to both send data to the second circuit and receive data from the second circuit using the same data interface.

When data is transmitted from the first circuit to the second circuit, the transmitter of the first circuit may be active while the transmitter of the second circuit may be placed in a high-impedance state. Similarly, when data is transmitted from the second circuit to the first circuit, the transmitter of the second circuit may be active, while the transmitter of the first circuit may be placed in a high-impedance state In either of the preceding cases, a data interface exists between the first and second circuits when they are in communication with one another. Such an interface is referred to as a bidirectional or full-duplex interface.

It may be desirable to maximize the rate at which in data is transferred at such an interface. Accordingly, signal integrity is very important at these types of interfaces, and it is desirable to reduce or eliminate effects that can corrupt signals. In particular, reflections can degrade signal integrity thus reducing an interface's maximum data rate. These reflections can be caused by impedance mismatches between a transmitter (i.e. a source) and a receiver (i.e. a load). For this reason, in very high-speed communications applications, it may be desirable to at least match impedances between a source and its load to reduce reflections. Where the length of transmission line (e.g. a trace or a wire) from a transmitter to a receiver is appreciable, it may further be desirable to match the impedance of the source to the transmission line and to match the impedance of the transmission line to the load. This may be done by using series and parallel termination resistances.

Figure 1A:
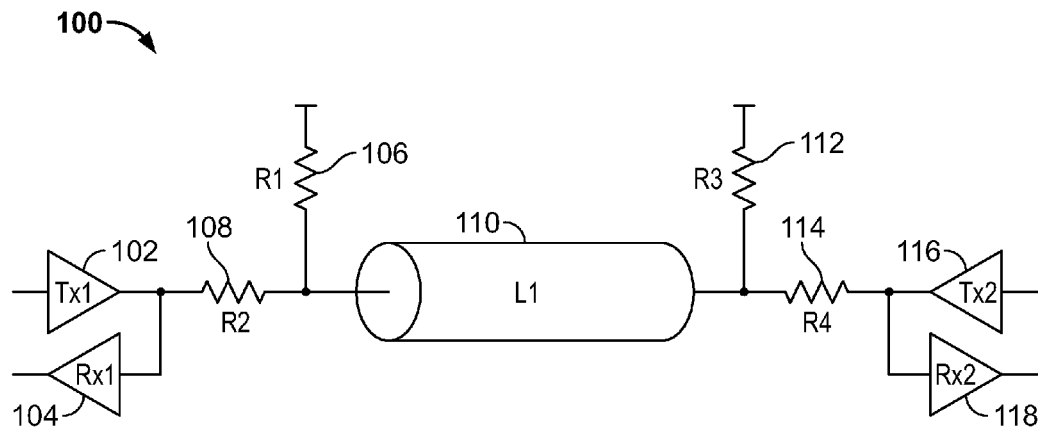
FIG. 1A shows an exemplary communication system which uses resistors for series and parallel termination.

FIG. 1A shows a data interface 100 that employs series and parallel termination resistors to reduce signal reflections and improve signal quality. Transmitter 102 uses the series resistor 108 to provide a series termination impedance when transmitting data to receiver 118 across transmission line 110. The receiver 118 uses resistor 112 to provide a parallel termination impedance when receiving the data. Accordingly, resistors 106 and 114 may not be used during the transmission from transmitter 102 to receiver 118. Similarly, transmitter 116 uses the series resistor 114 to provide a series termination impedance when transmitting data to receiver 104, while the receiver 104 uses resistor 106 to provide a parallel termination impedance when receiving the data. Accordingly, resistors 108 and 112 may not be used during the transmission from transmitter 116 to receiver 104

However, the resistors 106, 114, 108 and 112 still affect the data interface 100 when they are not being used. For example, when the transmitter 102 is transmitting, resistor 106 may cause a mismatch in source impedance as compared to the impedance of the transmission line 110. Accordingly, it may be desirable to effectively insert these resistances when needed and remove them when they are not. For example, in one solution, switches may be inserted in parallel or series with resistors 106, 114, 108 and 112. However the device sizes of the switches may then greatly increase the area consumed by these input and output circuits. Also, other complications, such as parasitic capacitance, may make this solution undesirable. An effective solution to this problem involves the use of transistors to provide the series and parallel termination impedances.

Figure 1B:
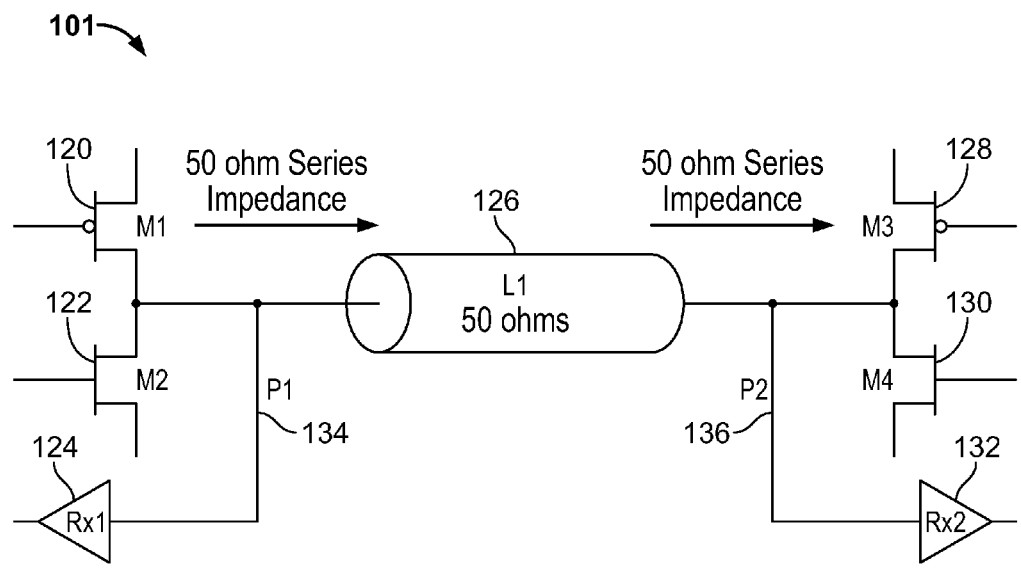
FIG. 1B shows an exemplary communication which uses transistors for series and parallel termination.

FIG. 1B shows a data interface 101 where transmitter output transistors are used to provide either a series or a parallel termination impedance to reduce reflections and improve signal quality. In this specific example, the transistors provide 50-ohm impedances, although it should be understood that other impedances can also be used.

The data interface 101 includes a first transmitter including transistors 120 and 122, and a second transmitter including transistors 128 and 130. Receiving circuits 124 and 132 and a transmission line 126 are also included. The transistors 120 and 122, and the receiver 124 can be formed on a first integrated circuit and connected to a first input/output pad 134, which is connected to pin 134, while the transistors 128 and 130, and the receiver 132 can be formed on a second integrated circuit and connected to a second input output pad 136. The first and second input/output pads 134 and 136 are connected to each other via the transmission line 126. In one embodiment, the first and second input/output pads 134 and 136 are connected to respective input/output pads of the first and second integrated circuits.

When the first transmitter outputs data, a 50-ohm output impedance is provided by the transistors 120 and 122. Specifically, when the first transmitter output pulls the voltage at the pin 134 to a high logic level (e.g., a '1'), the transistor 120 provides a 50-ohm series impedance. Similarly, when the transmitter output pulls the voltage at the pin 134 to a low logic level (e.g., a '0'), the transistor 122 provides a 50-ohm series impedance. When the second receiver 132 is receiving data (e.g. from a first transmitter), the output transistors 128 and 130 provide a 50-ohm parallel impedance for the receiver 132.

The output transistors for the first transmitter, 120 and 122, and the output transistors for the second transmitter, 128 and 130, are shown as single transistors for simplicity. However, these transistors may be composites of several individual transistors connected in parallel. Further, these transistors may be grouped, where drains, sources, and gates of the transistors in the groups are connected. In this configuration, collective drains and sources of the groups are also connected, but the gates of each group are driven by separate predrivers. In this way, some of the groups of transistors may be effectively disconnected or removed from the transmitter by turning them off under all conditions.

The output impedance of transistors, such as transistors 120 and 122 (or rather, transistor groups 120 and 122), varies as a function of temperature, device processing, and supply voltage. Thus, the impedance provided by transistor groups 120 and 122 often needs to be calibrated to provide an accurate termination impedance. This is done by disabling or enabling various individual transistors that make up transistor groups 120 and 122. Similarly, the transistors 128 and 130 can also be calibrated. This process is referred to herein as termination calibration.

Figure 2:
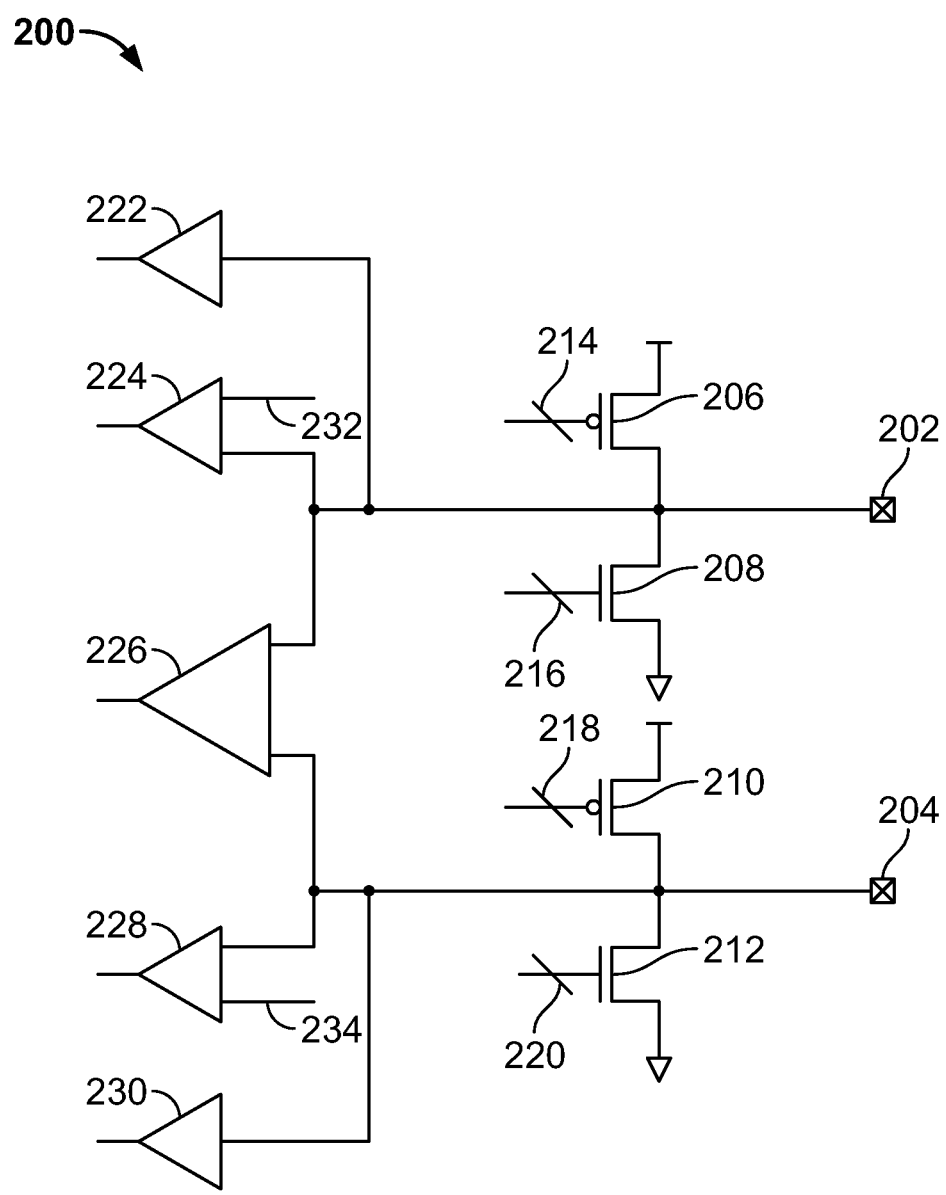
FIG. 2 shows exemplary transceiver circuitry used to implement systems and methods for termination calibration according to various embodiments of the present invention.

FIG. 2 shows exemplary transceiver circuitry 200 used to implement systems for termination calibration according to various embodiments of the present invention. In some embodiments, transceiver circuitry 200 is part of on-chip input/output circuitry for a larger system. In some embodiments, the input/output circuitry of the larger system includes a plurality of input/output banks, each input/output bank containing an instance of transceiver circuitry 200. In some embodiments, transceiver circuitry 200 is part of input/output circuitry of a programmable logic device (PLD) such as a field-programmable gate array (FPGA), and interfaces directly with the programmable (i.e. reconfigurable) logic portion of the FPGA, as well as other components of the FPGA. In some embodiments, transceiver circuitry 200 is part of input/output circuitry of a structured Application Specific Integrated Circuit (structured ASIC). In some embodiments, transceiver circuitry 200 is part of input/output circuitry of a PLD and interfaces directly with the programmable logic portion of the PLD, as well as other components of the PLD.

Transceiver circuitry 200 includes input/output pads 202 and 204. It should be noted that transceiver circuitry 200 may include more than two input/output pads. However, only two input/output pads are shown for simplicity.

In some embodiments, transceiver circuitry 200 includes groups of transistors 206, 208, 210 and 212. It should be understood that each of the transistor groups 206, 208, 210 and 212 may include more than one transistor, but is depicted as a single transistor for simplicity. The drain terminals of transistor groups 206 and 208 are connected to the input/output pad 202. The drain terminals of transistor groups 210 and 212 are connected to the input/output pad 204. Transistor groups 206 and 210 have their source terminals connected to a supply voltage provided by transceiver circuitry 200. In some embodiments, the supply voltage is used to encode a high logic level. Transistor groups 208 and 212 have their source terminals connected to a ground voltage provided by the transceiver circuitry. In some embodiments, the ground voltage is used to encode a low logic level. One or more control signals 214 are used to determine which transistors within transistor group 206 are turned on, and which ones are turned off. Similarly, one or more control signals 216, 218, and 220 are used to determine which transistors within transistor groups 208, 210 and 212, respectively, are turned on or off. Control signals are provided by various control circuitries within the device (not shown). In some embodiments, the transistor groups 206 and 208 are used to provide a controllably variable impedance at the input/output pad 202. In these embodiments, the impedance is adjusted by using control signals 214 and/or 216 to determine which transistors within the transistor groups are turned on and which ones are not. Similarly, control signals 218 and/or 220 may be used adjust the impedances of transistor groups 210 and/or 212 in order to provide a controllably variable impedance at the input/output pad 204. In some embodiments, transistor groups 206 and 210 are composed of P-Type Metal-Oxide Semiconductor logic (PMOS) transistors, and transistor groups 208 and 212 are composed of N-Type Metal-Oxide Semiconductor logic (NMOS) transistors.

In some embodiments, transceiver circuitry 200 includes single-input input buffers 222 and 230. It should be noted that transceiver circuitry 200 may include more than two single-input input buffers, though only two are shown in FIG. 2, for simplicity. The input buffers 222 and 230 can be used to provide signals received on the input/output pads 202 and 204, respectively, to other circuitries within the device. In some embodiments, the input buffers 222 and 230 are Transistor-Transistor Logic (TTL) input buffers.

In some embodiments, transceiver circuitry 200 includes differential input buffers 224 and 228. It should be noted that transceiver circuitry 200 may include more than two differential input buffers, though only two are shown in FIG. 2, for simplicity. Input buffer 224 can be used to compare a voltage level of a signal received on the input/output pad 202 to a reference voltage 232 provided by transceiver circuitry 200. Input buffer 228 can be used to compare a voltage level of a signal received on input/output pad 204 to a reference voltage 234 provided by transceiver circuitry 200. In some embodiments, the reference voltages 232 and 234 can be set by the user of system 200, or provided from an external source. In some embodiments, transceiver circuitry within a single input/output bank can provide a single reference voltage (e.g., reference voltages 232 and 234 are the same).

The differential input buffer 224 outputs a first logic level (for example, a high logic level) when the voltage level of the signal received at input/output pad 202 is greater than the reference voltage 232, and a second logic level (for example, a low logic level) when the voltage level of the signal received at input/output pad 202 is less than the reference voltage 232. The differential input buffer 228 outputs a first logic level (for example, a high logic level) when the voltage level of the signal received at input/output pad 204 is greater than the reference voltage 234, and a second logic level (for example, a low logic level) when the voltage level of the signal received at input/output pad 204 is less than the reference voltage 234. In some embodiments, differential input buffers 224 and 228 are High Speed Transceiver Logic (HSTL) buffers.

In some embodiments, transceiver circuitry 200 includes differential input buffer 226. It should be noted that transceiver circuitry 200 may include more than one differential input buffer, though only one is shown in FIG. 2, for simplicity. Differential input buffer 226 compares the voltage level of the signal received at input/output pad 202 to the voltage level of the signal received at input/output pad 204, and outputs a first or a second logic level, depending on which of the voltage levels is greater. For example, the differential input buffer 226 may output a high logic level when the signal received at input/output pad 202 is greater than the signal received at input/output pad 204, and a low logic level when the signal received at input/output pad 202 is less than the signal received at input/output pad 204. In some embodiments, the differential input buffer 226 is a Low Voltage Differential Signaling (LVDS) buffer. In some embodiments, the differential input buffer 226 is used by the device to receive data transmitted via differential signaling. Differential signaling is a method of transmitting data by means of two complementary signals sent on two separate transmission paths. For example, when used for differential signaling, the differential input buffer 226 outputs a high or a low logic level depending on the polarity of the difference between the voltage levels of the two signals received at input/output pads 202 and 204.

In some embodiments, transceiver circuitry 200 is contained in an input/output bank of an FPGA. In some embodiments, a control circuitry which adjusts the variable impedance of the transistor groups 206, 208, 210, and 212 is at least partially implemented using the programmable (i.e. reconfigurable) logic elements (i.e. the core fabrics) of the FPGA. In other embodiments, transceiver circuitry 200 is contained in an input/output bank of a structured ASIC a programmable logic portion containing programmable logic elements. In some embodiments, the control circuitry which adjusts the variable impedance of the transistor groups 206, 208, 210, and 212 is at least partially implemented using the programmable logic elements of the structured ASIC.

Figures 3A, 3B:
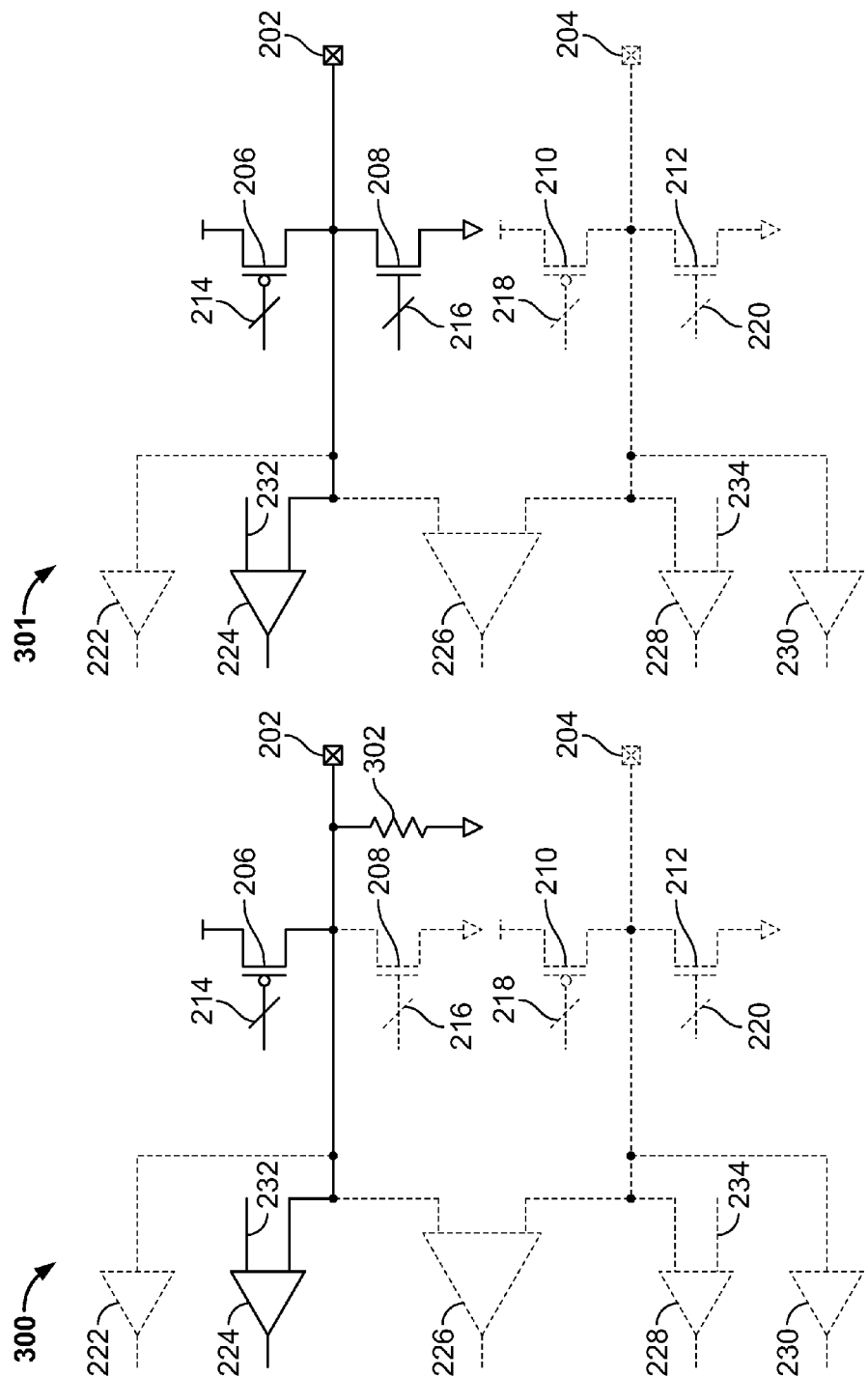
FIG. 3A shows an exemplary system for calibrating a pull-up circuit according to an embodiment of the present invention.
FIG. 3B shows an exemplary system for calibrating a pull-down circuit according to an embodiment of the present invention.

FIG. 3A shows an exemplary system 300 for calibrating a pull-up circuit according to an embodiment of the present invention. System 300 may use the elements of transceiver circuitry 200 shown in FIG. 2, in addition to other possible elements. In operation, system 300 may use elements 224, 232, 214, 206 and 202 of transceiver circuitry 200, as well as element 302. However, for ease of reference, the elements of transceiver circuitry 200 are shown. Likewise, FIGS. 3B, 4A, 4B, 5A and 5B may use the elements of transceiver circuitry 200, in addition to other possible elements. For ease of reference, in FIGS. 3B, 4A, 4B, 5A and 5B the elements of transceiver circuitry 200 are shown.

In system 300, the voltage level at input/output pad 202 is determined by using the transistor group 206 and a resistor 302 to form a controllably variable voltage divider. As used herein, a voltage divider is a structure, connected to a source voltage, which provides as its output a voltage which is a fraction of the source voltage. A controllably variable voltage divider is a voltage divider where the output fraction of the source voltage can be adjusted. In particular, system 300 uses the transistor group 206 to provide a conductive path between the supply voltage and the input/output pad 202, wherein the conductive path is characterized by the controllably variable impedance provided by the transistor group 206. System 300 also includes the resistor 302. In some embodiments, resistor 302 is external to transceiver circuitry 200. The resistance of resistor 302 may chosen such that it matches the impedance of the transmission line to which transceiver circuitry 200 is to be connected. Accordingly, if no other external voltage sources are connected to the input/output pad 202, the voltage level at the input/output pad 202 is a fraction of the supply voltage, wherein the fraction may determined by relationship between the impedance of the transistor group 206 and the resistance of the resistor 302.

The reference voltage 232 used by system 300 may be chosen such that it is a fraction of a voltage level corresponding to a high logic level. In some embodiments, the reference voltage level 232 may be chosen to be one half of the voltage level corresponding to a high logic level.

In some embodiments, system 300 calibrates the pull-up circuit as follows. The differential input buffer 224 compares the voltage level at the input/output pad 202 to the reference voltage level 232, and outputs a first logic level when the voltage level at the input/output pad 202 is the greater of the two, and a second logic level when the reference voltage level 232 is the greater of the two. In some embodiments, the first logic level is a high logic level, and the second logic level is a low logic level. Control circuitry (not shown) then uses the output of the differential input buffer 224 to adjust the controllably variable impedance provided by the transistor group 206. In some embodiments, the control circuitry uses an iterative calibration process to iteratively adjust the controllably variable impedance of the transistor group 206. At each iteration of the calibration process, the differential input buffer 224 compares the voltage level at the input/output pad 202 to the reference voltage level 232. If the voltage level at the input/output pad 202 is greater than the reference voltage level 232, the control circuitry may increase the impedance provided by the transistor group 206 by turning off individual transistors within the group 206 via corresponding control signals 214. Similarly, if the voltage level at the input/output pad 202 is less than the reference voltage level, the control circuitry may decrease the impedance provided by the transistor group 206 by turning on individual transistors within the group. Because the voltage level at the input/output pad 202 is determined by the ratio of the total impedance of the transistor group 206 and the resistance of the resistor 302, the voltage level decreases when the total impedance is increased, and increases when the total impedance is decreased. The iterative calibration process proceeds until an ending condition is satisfied. For example, in some embodiments, the calibration process stops when the voltage level at the input/output pad 202 has reached a steady state, i.e. when the output of the differential input buffer 224 changes between a logic high level and a logic low level at every iteration of the calibration process.

FIG. 3B shows an exemplary system 301 for calibrating a pull-down circuit according to an embodiment of the present invention. System 301 may use the elements of transceiver circuitry 200 shown in FIG. 2, in addition to other possible elements. In operation, system 301 may use elements 224, 232, 214, 206, 216, 208 and 202 of transceiver circuitry 200. However, for ease of reference, the elements of transceiver circuitry 200 are shown.

In some embodiments, system 301 uses the transistor group 206 and the transistor group 208 to form a controllably variable voltage divider. In these embodiments, the voltage level at input/output pad 202 is determined by a ratio of the total impedance of transistor group 206, which has its source terminals connected to the supply voltage, to the total impedance of the transistor group 208, which has its source terminals connected to the ground voltage. In some embodiments, the system 301 uses the control signals 216 to set the impedance provided by the transistor group 208 to be substantially the same as an impedance determined by a system for calibrating a pull-up circuit, such as system 300. In other embodiments, every transistor in the transistor group 206 is turned off, and an external resistor connected to the supply voltage (not shown) is used along with the transistor group 208 to form a controllably adjustable voltage divider which determines the voltage level at input/output pad 202.

In some embodiments, system 301 calibrates the pull-down circuit as follows. The differential input buffer 224 compares the voltage level at the input/output pad 202 to the reference voltage level 232, and outputs a first logic level when the voltage level at the input/output pad 202 is the greater of the two, and a second logic level when the reference voltage level 232 is the greater of the two. In some embodiments, the first logic level is a high logic level, and the second logic level is a low logic level. Control circuitry (not shown) then uses the output of the differential input buffer 224 to adjust the controllably variable impedance provided by the transistor group 208. In some embodiments, the control circuitry may adjust the impedance provided by the transistor group 208 by using an iterative calibration process that is similar to that used by system 300, but which operates on the transistor group 208 rather than on the transistor group 206, and uses the control signals 216 rather than the control signals 214.

FIG. 4A shows an exemplary system 400 for calibrating a pull-up circuit according to an embodiment of the present invention. System 400 may use the elements of transceiver circuitry 200 shown in FIG. 2, in addition to other possible elements. In operation, system 400 may use elements 226, 214, 206, 202 and 204 of transceiver circuitry 200 as well as elements 402, 404 and 406. However, for ease of reference, the elements of transceiver circuitry 200 are shown.

System 400 uses the differential input buffer 226 to compare a voltage level at the input/output pad 202 with a reference voltage level at the input/output pad 204. In some embodiments, the reference voltage level at input/output pad 204 is determined by using two resistors 404 and 406 to form a voltage divider, as shown in FIG. 4A. In other embodiments, the resistors 404 and 406 are not used, and the reference voltage level is provided to the input/output pad 204 by an external source. The voltage level at input/output pad 202 is determined by using the transistor group 206 and a resistor 402 to form a controllably variable voltage divider. System 400 uses control signals 214 to adjust the impedance provided by the transistor group 206, thereby controlling the controllably variable voltage divider and determining the voltage level at input/output pad 202.

In some embodiments, system 400 calibrates the pull-up circuit as follows. The differential input buffer 226 compares the voltage level at the input/output pad 202 to the reference voltage level at the input/output pad 204, and outputs a first logic level when the voltage level at the input/output pad 202 is the greater of the two, and a second logic level when the reference voltage level at the input/output pad 204 is the greater of the two. In some embodiments, the first logic level is a high logic level, and the second logic level is a low logic level. Control circuitry (not shown) then uses the output of the differential input buffer 226 to adjust the controllably variable impedance provided by the transistor group 206. In some embodiments, the control circuitry uses an iterative calibration process to iteratively adjust the controllably variable impedance of the transistor group 206. At each iteration of the calibration process, the differential input buffer 226 compares the voltage level at the input/output pad 202 to the reference voltage level at the input/output pad 204. If the voltage level at the input/output pad 202 is greater than the reference voltage level at the input/output pad 204, the control circuitry may increase the impedance provided by the transistor group 206 by turning off individual transistors within the group 206 via corresponding control signals 214. Similarly, if the voltage level at the input/output pad 202 is less than the reference voltage level, the control circuitry may decrease the impedance provided by the transistor group 206 by turning on individual transistors within the group. Because the voltage level at the input/output pad 202 is determined by the ratio of the total impedance of the transistor group 206 and the resistance of the resistor 402, the voltage level decreases when the total impedance is increased, and increases when the total impedance is decreased. The iterative calibration process proceeds until an ending condition is satisfied. For example, in some embodiments, the calibration process stops when the voltage level at the input/output pad 202 has reached a steady state, i.e. when the output of the differential input buffer 226 changes between a logic high level and a logic low level at every iteration of the calibration process.

FIG. 4B shows an exemplary system 401 for calibrating a pull-down circuit according to an embodiment of the present invention. System 401 may use the elements of transceiver circuitry 200 shown in FIG. 2, in addition to other possible elements. In operation, system 401 may use elements 226, 214, 206, 216, 208, 202 and 204 of transceiver circuitry 200 as well as elements 404 and 406. However, for ease of reference, the elements of transceiver circuitry 200 are shown.

System 401 uses the differential input buffer 226 to compare the voltage level at the input/output pad 202 with the reference voltage level at the input/output pad 204. In some embodiments, the reference voltage level at input/output pad 204 is determined by using two resistors 404 and 406 to form a voltage divider, as shown in FIG. 4B. In other embodiments, the resistors 404 and 406 are not used, and the reference voltage level is provided to the input/output pad 204 from an external source. In some embodiments, the voltage level at input/output pad 202 is determined by using the transistor group 206 and the transistor group 208 to form a controllably variable voltage divider. In these embodiments, the voltage level at input/output pad 202 is determined by a ratio of the total impedance of transistor group 206, which has its source terminals connected to the supply voltage, to the total impedance of the transistor group 208, which has its source terminals connected to the ground voltage. In some embodiments, the system 401 uses the control signals 216 to set the impedance provided by the transistor group 208 to be substantially the same as an impedance determined by a system for calibrating a pull-up circuit, such as system 400. In other embodiments, every transistor in the transistor group 206 is turned off, and an external resistor connected to the supply voltage (not shown) is used along with the transistor group 208 to form a controllably adjustable voltage divider which determines the voltage level at input/output pad 202.

In some embodiments, system 401 calibrates the pull-down circuit as follows. The differential input buffer 226 compares the voltage level at the input/output pad 202 to the reference voltage level at the input/output pad 204, and outputs a first logic level when the voltage level at the input/output pad 202 is the greater of the two, and a second logic level when the reference voltage level at the input/output pad 204 is the greater of the two. In some embodiments, the first logic level is a high logic level, and the second logic level is a low logic level. Control circuitry (not shown) then uses the output of the differential input buffer 226 to adjust the controllably variable impedance provided by the transistor group 208. In some embodiments, the control circuitry may adjust the impedance provided by the transistor group 208 by using an iterative calibration process that is similar to that used by system 400, but which operates on the transistor group 208 rather than on the transistor group 206, and uses the control signals 216 rather than control the control signals 214.

FIG. 5A shows an exemplary system 500 for calibrating a pull-up circuit according to an embodiment of the present invention. System 500 may use the elements of transceiver circuitry 200 shown in FIG. 2, in addition to other possible elements. In operation, system 500 may use elements 224, 232, 226, 214, 206, 202 and 204 of transceiver circuitry 200 as well as elements 502, 504 and 506. However, for ease of reference, the elements of transceiver circuitry 200 are shown.

System 500 uses the differential input buffer 224 to compare the voltage level at input/output pad 202 with a first reference voltage level 232. System 500 also uses the differential input buffer 226 to compare the voltage level at the input/output pad 202 with a second reference voltage level at the input/output pad 204.

In some embodiments, the reference voltage level 232 is configured by a user of system 500, or provided by an external source. In some embodiments, the reference voltage level at input/output pad 204 is determined by using two resistors 504 and 506 to form a voltage divider, as shown in FIG. 5A. In other embodiments, the resistors 504 and 506 are not used, and the reference voltage level is provided to the input/output pad 204 from an external source. The voltage level at input/output pad 202 is determined by using the transistor group 206 and a resistor 502 to form a controllably variable voltage divider.

In some embodiments, system 500 calibrates the pull-up circuit as follows. The differential input buffer 224 compares the voltage level at the input/output pad 202 to the first reference voltage level 232, and outputs a first logic level when the voltage level at the input/output pad 202 is the greater of the two, and a second logic level when the first reference voltage level 232 is the greater of the two. The differential input buffer 226 compares the voltage level at the input/output pad 202 to the second reference voltage level at the input/output pad 204, and outputs a first logic level when the voltage level at the input/output pad 202 is the greater of the two, and a second logic level when the second reference voltage level at the input/output pad 204 is the greater of the two. In some embodiments, the first logic level is a high logic level, and the second logic level is a low logic level. Control circuitry (not shown) then uses the output of the differential input buffer 224 and the output of the differential input buffer 226 to adjust the controllably variable impedance provided by the transistor group 206. In some embodiments, the outputs of differential input buffers 224 and 226 can be used in an iterative calibration process. In such embodiments, impedance provided by the transistor group 206 is iteratively adjusted until the voltage level at the input/output pad 202 is within a voltage range defined by the first and second reference voltages. For example, at each iteration of the calibration process, the control circuitry may check whether the voltage level at the input/output pad 202 is greater than each of the first and second reference voltages. If the control circuitry determines that the voltage level at the input/output pad 202 is greater than both of the reference voltage levels, the impedance provided by the transistor group 206 is increased, thereby lowering the voltage level at the input/output pad 202. If the control circuitry determines that the voltage level at the input/output pad 202 is less than both of the reference voltage levels, the impedance provided by the transistor group 206 is decreased, thereby raising the voltage level at the input/output pad 202. If the control circuitry determines that the voltage level at the input/output pad 202 is greater than one reference voltage level and less than the other reference voltage level, the voltage level at the input/output pad 202 is within the range of voltages defined by the two reference voltage levels, and the calibration process terminates.

FIG. 5B shows an exemplary system 501 for calibrating a pull-down circuit according to an embodiment of the present invention. System 501 may use the elements of transceiver circuitry 200 shown in FIG. 2, in addition to other possible elements. In operation, system 501 may use elements 224, 232, 226, 214, 206, 216, 208, 202 and 204 of transceiver circuitry 200 as well as elements 504 and 506. However, for ease of reference, the elements of transceiver circuitry 200 are shown.

System 501 uses the differential input buffer 224 to compare the voltage level at input/output pad 202 with a first reference voltage level 232 provided by system 500. System 501 also uses the differential input buffer 226 to compare the voltage level at the input/output pad 202 with a second reference voltage level at the input/output pad 204.

In some embodiments, the reference voltage level 232 is configured by a user of system 501, or provided by an external source. In some embodiments, the reference voltage level at input/output pad 204 is determined by using two resistors 504 and 506 to form a voltage divider, as shown in FIG. 5B. In other embodiments, the resistors 504 and 506 are not used, and the reference voltage level is provided to the input/output pad 204 from an external source. The voltage level at input/output pad 202 is determined by using the transistor group 206 and the transistor group 208 to form a controllably variable voltage divider. In such embodiments, system 501 uses control signals 216 to adjust the impedance provided by the transistor group 208, thereby controlling the controllably variable voltage divider and determining the voltage level at input/output pad 202. In some embodiments, the system 501 uses the control signals 214 to set the impedance provided by the transistor group 206 to be substantially the same as an impedance determined by a system for calibrating a pull-up circuit, such as system 500. In other embodiments, every transistor in the transistor group 206 is turned off, and an external resistor connected to the supply voltage (not shown) is used along with the transistor group 208 to form a controllably adjustable voltage divider which determines the voltage level at input/output pad 202.

In some embodiments, system 501 calibrates the pull-down circuit as follows. The differential input buffer 224 compares the voltage level at the input/output pad 202 to the first reference voltage level 232, and outputs a first logic level when the voltage level at the input/output pad 202 is the greater of the two, and a second logic level when the first reference voltage level 232 is the greater of the two. The differential input buffer 226 compares the voltage level at the input/output pad 202 to the second reference voltage level at the input/output pad 204, and outputs a first logic level when the voltage level at the input/output pad 202 is the greater of the two, and a second logic level when the second reference voltage level at the input/output pad 204 is the greater of the two. In some embodiments, the first logic level is a high logic level, and the second logic level is a low logic level. Control circuitry (not shown) uses the output of the differential input buffer 224 and the output of the differential input buffer 226 to adjust the controllably variable impedance provided by the transistor group 208. In some embodiments, the control circuitry may adjust the impedance provided by the transistor group 208 by using an iterative calibration process that is similar to that used by system 500, but which operates on the transistor group 208 rather than on the transistor group 206, and uses the control signals 216 rather than control the control signals 214.

Systems 500 and 501 are shown in FIGS. 5A and 5B as being implemented using one instance of transceiver circuitry 200. However, other configurations are possible. In some embodiments, of the present invention the differential input buffer 224 and its associated circuitry may be located in transceiver circuitry 200 of one input/output bank, while the differential input buffer 226 and its associated circuitry may be located in transceiver circuitry 200 of a different input/output bank. In such embodiments, a modified system 500 is implemented essentially as a combination of systems 300 and 400 connected to a common input/output pad, with each system comparing the voltage level at the output pad to a different reference voltage. A modified system 501 may similarly be implemented as a combination of systems 301 and 401 connected to a common input/output pad.

Additionally, a modified system 500 can be implemented using two instances of system 300 located in two different input/output banks. In some embodiments, only a single reference voltage may be provided by an input/output bank containing an instance of system 300. However, two different input/output banks can provide two different reference voltage levels. Accordingly, modified system 500 may use a differential input buffer 224 in a first input/output bank to compare a voltage level at the output pad 202 of the first input/output bank to a first reference voltage, outputting a first logic level if the voltage level at the output pad 202 of the first input/output bank is the greater of the two, and outputting a second logic level if the first reference voltage level is the greater of the two. Modified system 500 may further use a differential input buffer 224 in a first input/output bank to compare a voltage level at the output pad 202 of the second input/output bank to a second reference voltage, outputting a first logic level if the voltage level at the output pad 202 of the second input/output bank is the greater of the two, and outputting a second logic level if the second reference voltage level is the greater of the two. In some embodiments, the first logic level is a high logic level, and the second logic level is a low logic level. The input/output pad 202 of the first output bank may be connected to the input/output pad 202 of the second input/output bank, such that the voltage level at the two input/output pads is the same. The control circuitry may then use the two logic levels output by the first and second input/output banks to adjust a controllably variable impedance associated with the input/output pads 202 of the first and second input/output banks to bring the voltage level at the input/output pads 202 of the first and second input/output banks into a range defined by the first and second reference voltages. In some embodiments, the control circuitry of modified system 500 may adjust the controllably variable impedance associated with the input/output pads 202 of the first and second input/output banks by using an iterative calibration process that is similar to that used by system 500. Similarly, the modified system 500 can be implemented using two instances of system 400 located in two different input/output banks. A modified system 501 can similarly be implemented as a combination of two instances of system 301, or a combination of two instances of system 401.

In some embodiments, systems 301, 401 and 501 as shown in FIGS. 3B, 4B and 5B may include additional control circuitry to switch between a calibration mode and a transmit/receive mode. In the transmit mode, the input/output pad 202 of the system is connected to a communication path. The group of transistors 206 provide a series termination impedance between the supply voltage and the input/output pad 202 when transmitting a logical high signal. The group of transistors 206 provide a series termination impedance between the ground voltage and the input/output pad 202 when transmitting a logical low signal. In the receive mode, the groups of transistors 206 and 208 are used to provide a parallel termination impedance for a received signal. In some embodiments, the termination impedances provided by the groups of transistors 206 and 208 when transmitting a logical high signal and the logical low signal are determined using the calibration mode.

Figure 6:
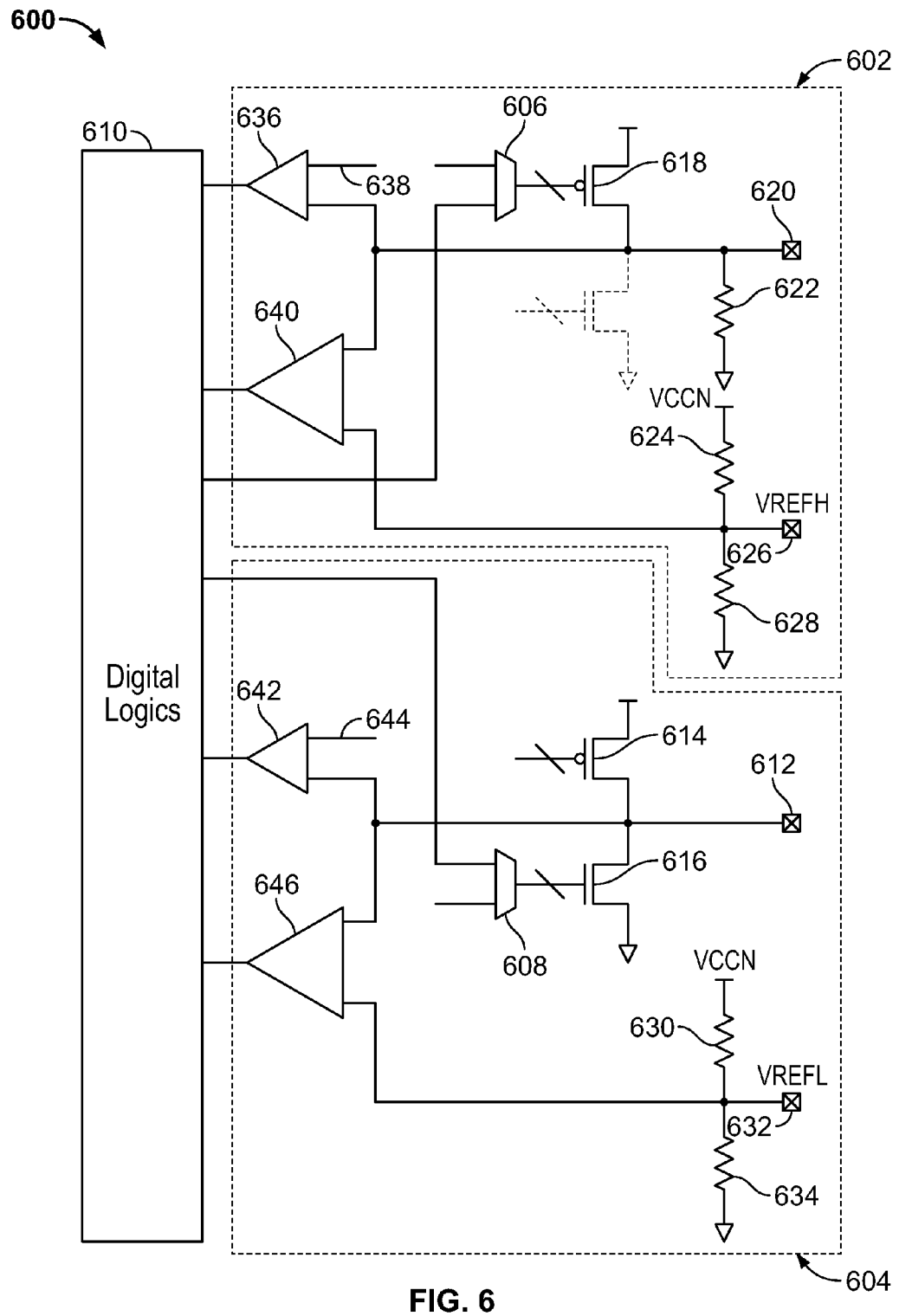
FIG. 6 shows an exemplary system for termination and calibration according to an embodiment of the present invention.

FIG. 6 shows an exemplary system 600 for termination and calibration according to an embodiment of the present invention. System 600 includes an instance of system 500 serving as a calibration system 602 for a pull-up circuit. System 600 further includes an instance of system 501 serving as a calibration system 604 for a pull-down circuit. Accordingly, elements 640, 636, 638, 618, 620, 622, 624, 626 and 628 of system 600 correspond to elements 226, 224, 232, 206, 202, 502, 504, 204 and 506, respectively, of system 500. Elements 646, 642, 644, 614, 612, 616, 630, 632 and 634 of system 600 correspond to elements 226, 224, 232, 206, 202, 208, 504, 204 and 506 of system 501, respectively. System 600 additionally includes control circuitry 610. System 600 additionally includes control circuitry (not shown) operable to switch system 600 between calibration mode and a transmit/receive mode by using multiplexers 606 and 608. In some embodiments, in transmit/receive mode, the group of transistors 614 is used as a pull-up circuit and the group of transistors 616 is used as a pull-down circuit.

In some embodiments, system 600 operates as follows. The pull-up calibration system 602 determines an appropriate impedance for a pull-up circuit, and provides it to control circuitry 610. In some embodiments, the process by which system 600 determines an appropriate impedance for a pull-up circuit is substantially the same as that used by system 500. A group of transistors 614 contained in system 604 is configured to provide the determined impedance for a pull-up circuit, and system 604 determines an appropriate impedance for a pull-down circuit. The control circuitry provides the determined impedances for the pull-up circuit and the pull-down circuit to one or more transmitter/receiver circuitries (which may, for example, be substantially the same as system 200), which use the determined impedances to provide a series termination impedance when transmitting and a parallel termination impedance when receiving. Advantageously, system 600 may thus provide termination calibration for multiple transmitter/receiver circuitries. In some embodiments control circuitry 610 uses the group of transistors 614 as a pull up-circuit and the group of transistors 616 as a pull-down circuit in order to provide a series termination impedance when transmitting and a parallel termination impedance when receiving. In some embodiments, multiplexers 606 and 608 may be used to allow circuitries 602 and 604 to be reconfigured as regular transmitter/receiver circuitries when they are not being used as pull-up and pull-down calibration systems, thus freeing up additional hardware resources.

In some embodiments, elements of systems 300-600 (i.e. 300, 301, 400, 401, 500, 501 and 600) are contained entirely within the transceiver circuitry of an FPGA. In some embodiments, the control circuitry which adjusts the variable impedance of the transistor groups is implemented using the core logic elements of an FPGA. In some embodiments, elements of systems 300-600 are contained entirely within the transceiver circuitry of a structured ASIC. In some embodiments, the control circuitry which adjusts the variable impedance of the transistor groups is implemented using the core logic elements of a structured ASIC.

It should be noted that systems 300-600 are not limited to using the structure of the exemplary transceiver circuitry 200. Rather, the elements of transceiver circuitry 200 that are not used by the respective systems may not be present in the respective systems. Additionally, the elements of transceiver circuitry 200 which are used by the systems may be arranged and coupled in a manner different from that shown in FIG. 2, as long as all of the elements used by the respective systems are present, and the connections used by the respective systems may be made.

Figure 7:
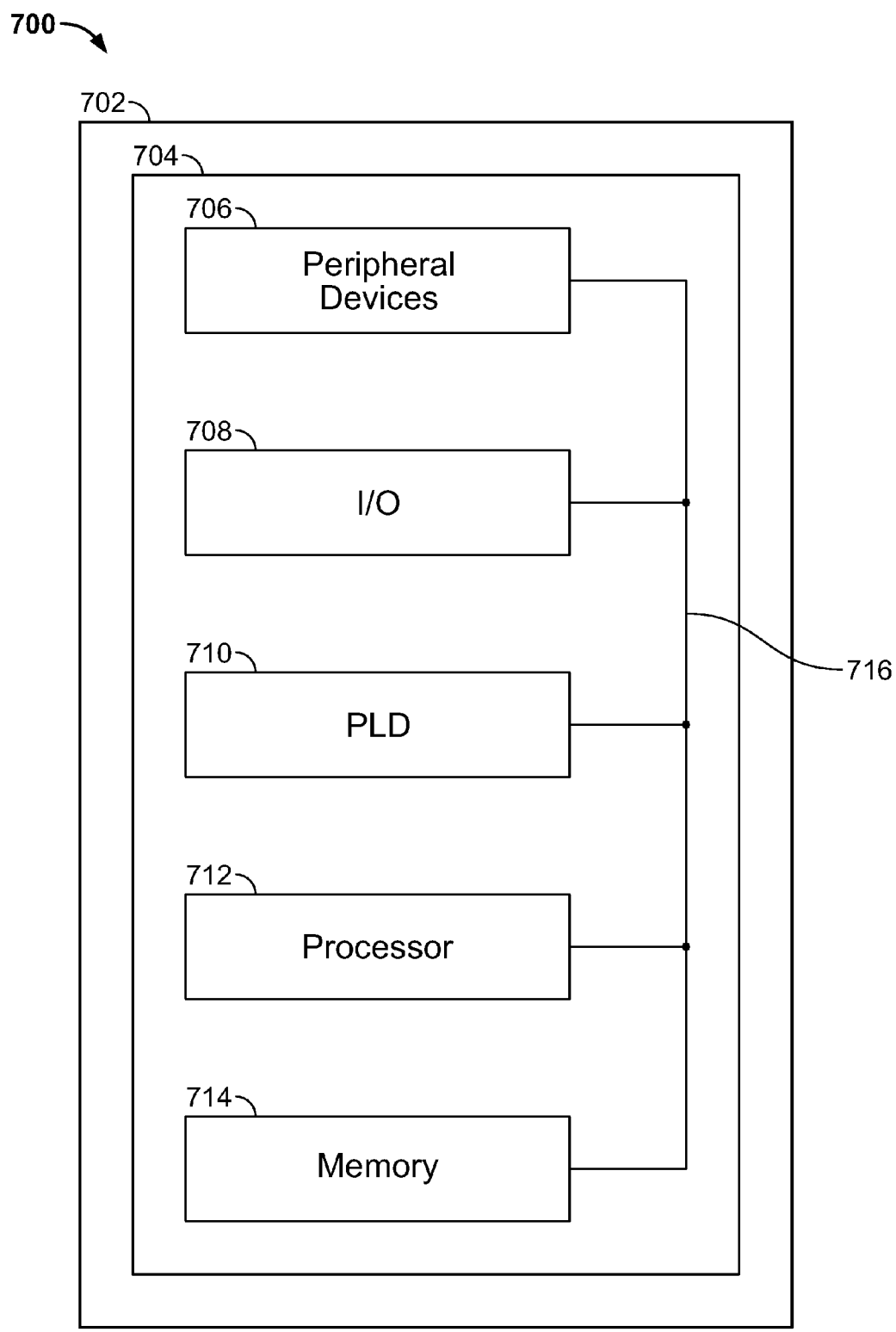
FIG. 7 shows an exemplary programmable logic device that may be used to implement embodiments the present invention.

FIG. 7 illustrates an exemplary system 700 which includes embodiments of the present invention within a data processing system 700. Data processing system 700 may be or may include an FPGA, a structured ASIC, an application specific standard product (ASSP), a full-custom chip, or a dedicated chip. Data processing system 700 may include a programmable logic device (PLD) 710. Data processing system 700 may also include one or more of the following components: a processor 712, memory 714, input/output circuitry 708, and peripheral devices 706. These components are coupled together by a system bus or other interconnections 716 and may be populated on a circuit board 704 which may be contained in an end-user system 702.

The input/output banks and/or transceiver circuitry as used by transceiver circuitry 200 and systems 300-600 and any variations thereof within the scope of the present invention may be implemented using or as part of the input/output circuitry 708 and/or 710. The control circuitry of transceiver circuitry 200 systems 300-600 and any variations thereof within the scope of the present invention may implemented using the programmable logic device 710 and/or using the processor 712.

System 700 may be used in a wide variety of applications, such as computer networking, data networking, instrumentation, video processing, digital signal processing, or any other application where the advantage of using programmable or reprogrammable logic is desirable. PLD 710 may be used to perform a variety of different logic functions. For example, PLD 710 may be configured as a processor or controller that works in cooperation with processor 712. PLD 710 may also be used as an arbiter for arbitrating access to a shared resource in system 110. In yet another example, PLD 710 may be configured as an interface between processor 712 and one of the other components in system 700.

The foregoing is merely illustrative of the principles of this invention and various modifications can be made by those skilled in the art without departing from the scope and spirit of the invention. The above described embodiments of the present invention are presented for purposes of illustration and not of limitation, and the present invention is limited only by the claims which follow.

What is claimed is:

1. A system comprising:
   first differential input buffer circuitry configured to output a first input buffer circuitry output signal by comparing a first signal level at an input/output pad with a second signal level;
   termination circuitry configured to provide a controllably variable impedance associated with the input/output pad;
   control circuitry configured to control the controllably variable impedance provided by the termination circuitry based at least in part on a voltage level of the first differential input buffer circuitry output signal; and
   second differential input buffer circuitry configured to output a second differential input buffer circuitry output signal by comparing the first signal level associated with the input/output pad with a third signal level, wherein:
   the third signal level is different from the second signal level,
   the control circuitry is further configured to control the impedance provided by the termination circuitry based at least in part on the second differential input buffer circuitry output signal,
   the first differential input buffer circuitry comprises high speed transceiver logic (HSTL) circuitry, and
   the second differential input buffer circuitry comprises low voltage differential buffer (LVDS) circuitry.

2. The system of claim 1, wherein the first differential input buffer circuitry and the second differential input buffer circuitry are contained within a first input/output bank of a larger system.

3. The system of claim 1 wherein:
   the first differential input buffer circuitry is contained within a first input/output bank of a larger system, and
   the second differential input buffer circuitry is contained within a second input/output bank of the larger system.

4. The system of claim 1, wherein the control circuitry is further configured to transmit and receive data based at least in part on controlling the controllably variable impedance provided by the termination circuitry.

5. The system of claim 1, wherein the control circuitry is configured to control the controllably variable impedance provided by the termination circuitry to match an impedance of a transmission path, wherein:
   the transmission path is coupled to the input/output pad.

6. The system of claim 1, wherein the control circuitry comprises programmable logic circuitry.

7. The system of claim 6, wherein:
   the programmable logic circuitry is configured to control the controllably variable impedance provided by the termination circuitry according to calibration instructions implemented in soft logic.

8. The system of claim 1, wherein the termination circuitry comprises a plurality of transistors.

9. The system of claim 1, wherein the first differential input buffer circuitry is part of differential signaling circuitry.

10. A system comprising:
    a first input/output pad;
    a second input/output pad;
    input/output circuitry comprising:
    a first differential input buffer circuitry, wherein:
      a first input of the first differential input buffer circuitry is coupled to the first input/output pad, and
      a second input of the first differential input buffer circuitry is coupled to the second input/output pad; and
    second differential input buffer circuitry, wherein:
      a first input of the second differential input buffer circuitry is coupled to the first input/output pad, and
      a second input of the second differential input buffer circuitry is coupled a reference voltage level; and
    control circuitry configured to control a controllably variable impedance provided by a termination circuitry based at least in part on an output voltage level of the first differential input buffer circuitry and based at least in part on an output voltage level of the second differential input buffer circuitry.

11. The system of claim 10, wherein the control circuitry is a programmable logic circuitry.

12. The system of claim 11, wherein:
    the control circuitry is configured to control the controllably variable impedance provided by the termination circuitry according to calibration instructions implemented in soft logic.

13. The system of claim 10, wherein the control circuitry is further configured to transmit and receive data based at least in part on controlling the controllably variable impedance provided by the termination circuitry.

14. The system of claim 10, wherein the control circuitry is further configured to control the controllably variable impedance provided by the termination circuitry to match an impedance of a transmission path, wherein:
- the transmission path is coupled to the first input/output pad.

15. A method for using a circuit, the method comprising:
- providing first differential input buffer circuitry output signal by comparing, with first differential input buffer circuitry, a first signal level associated with an input/output pad with a second signal level;
- controlling the impedance associated with the input/output pad based at least in part on a voltage level of the first differential input buffer circuitry output signal; and
- providing second differential input buffer circuitry configured to output a second differential input buffer circuitry output signal by comparing the first signal level associated with the input/output pad with a third signal level, wherein:
  - the third signal level is different from the second signal level,
  - the control circuitry is further configured to control the impedance provided by the termination circuitry based at least in part on the second differential input buffer circuitry output signal,
  - the first differential input buffer circuitry comprises high speed transceiver logic (HSTL) circuitry, and
  - the second differential input buffer circuitry comprises low voltage differential buffer (LVDS) circuitry.

16. The method of claim 15, wherein the first buffer circuitry is part of differential signaling circuitry.

17. The method of claim 15, wherein the controlling the impedance comprises matching the impedance of the input/output pad to an impedance of a transmission path, wherein coupled to the input/output pad.

18. The method of claim 15, further comprising transmitting and receiving data based at least in part on controlling the impedance associated with the input/output pad.

\* \* \* \* \*